United States Patent
Wang et al.

(10) Patent No.: US 7,287,320 B2
(45) Date of Patent: Oct. 30, 2007

(54) METHOD FOR PROGRAMMING A ROUTING LAYOUT DESIGN THROUGH ONE VIA LAYER

(75) Inventors: Hsin-Shih Wang, Fremont, CA (US); Shang-Jyh Shieh, Kao-Hsiung Hsien (TW); Ming-Hsin Ku, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 447 days.

(21) Appl. No.: 10/708,785

(22) Filed: Mar. 25, 2004

(65) Prior Publication Data
US 2005/0055828 A1 Mar. 17, 2005

(30) Foreign Application Priority Data
Sep. 17, 2003 (TW) .............................. 92125671 A (51) Int. Cl.
*H05K 3/30* (2006.01)
(52) U.S. Cl. .............................. 29/834; 29/846; 29/852; 29/857; 29/868; 257/208; 257/635; 257/701; 257/702; 257/E23.077; 257/E23.108; 716/1; 716/12; 716/15
(58) Field of Classification Search ................... 29/834, 29/846, 852, 857, 868; 257/208, 635, 701, 257/702, E23.077, E23.108; 716/1, 12, 15
See application file for complete search history.

(56) References Cited

U.S. PATENT DOCUMENTS

| | | | | |
|---|---|---|---|---|
| 4,777,606 | A | * 10/1988 | Fournier | ....................... 716/12 |
| 6,448,631 | B2 | * 9/2002 | Gandhi et al. | ............... 257/635 |
| 6,691,296 | B1 | * 2/2004 | Nakayama et al. | ........... 716/15 |

OTHER PUBLICATIONS

Protel 99 SE Designer's Handbook Supplement—Copyright 1999.*
* cited by examiner

*Primary Examiner*—A. Dexter Tugbang
*Assistant Examiner*—Tim Phan
(74) *Attorney, Agent, or Firm*—Winston Hsu (57) ABSTRACT

A method for programming a routing layout design through one via layer includes forming a plurality of metal traces on a first routing layer and a second routing layer, and positioning a plurality of vias within a via layer disposed between the first and second routing layers for connecting the metal traces on the first and second routing layers according to a first current route defined by a predetermined circuit layout design to connect a first node and a second node so as to establish a second current route equivalent to the first current route.

15 Claims, 8 Drawing Sheets

METHOD FOR PROGRAMMING A ROUTING LAYOUT DESIGN THROUGH ONE VIA LAYER

CROSS REFERENCE TO RELATED DOCUMENT

This application claims priority to Taiwanese Patent Application No. 092125671, filed on Sep. 17, 2003.

BACKGROUND OF INVENTION

1. Field of the Invention

The invention relates to a method for programming a routing layout design, and more particularly, to a method that utilizes a single via layer for programming a routing layout design through two metal layers with predetermined metal trace allocation.

2. Description of the Prior Art

In the past, electrical elements, such as capacitances and resistances, have been connected through a rigid circuit board. However, as the development of semiconductor technologies progresses, integrated circuits (ICs) are widely applied to electrical devices, which means the electrical elements and metal traces for connecting those electrical elements are fabricated in the same chip by the same semiconductor process. Recently, sub-micro and deep sub-micro processes have been adopted to effectively reduce line widths of the elements, so that each chip can comprise many more elements and more complex circuits. Generally, the above-mentioned metal traces are formed on the metal layers. As semiconductor process technology develops, the amount of the metal layers for positioning the metal traces also increases. For example, a 0.18 micro process implements six metal layers for positioning metal traces. Concerning a 0.13 micro process, eight metal layers are implemented. Therefore, the required amount of photomasks for defining metal traces routed on all the metal layers increases as the semiconductor process technology progresses. In other words, the cost of the photomasks will occupy a great proportion of the total fabrication cost of ICs.

Figure 1:
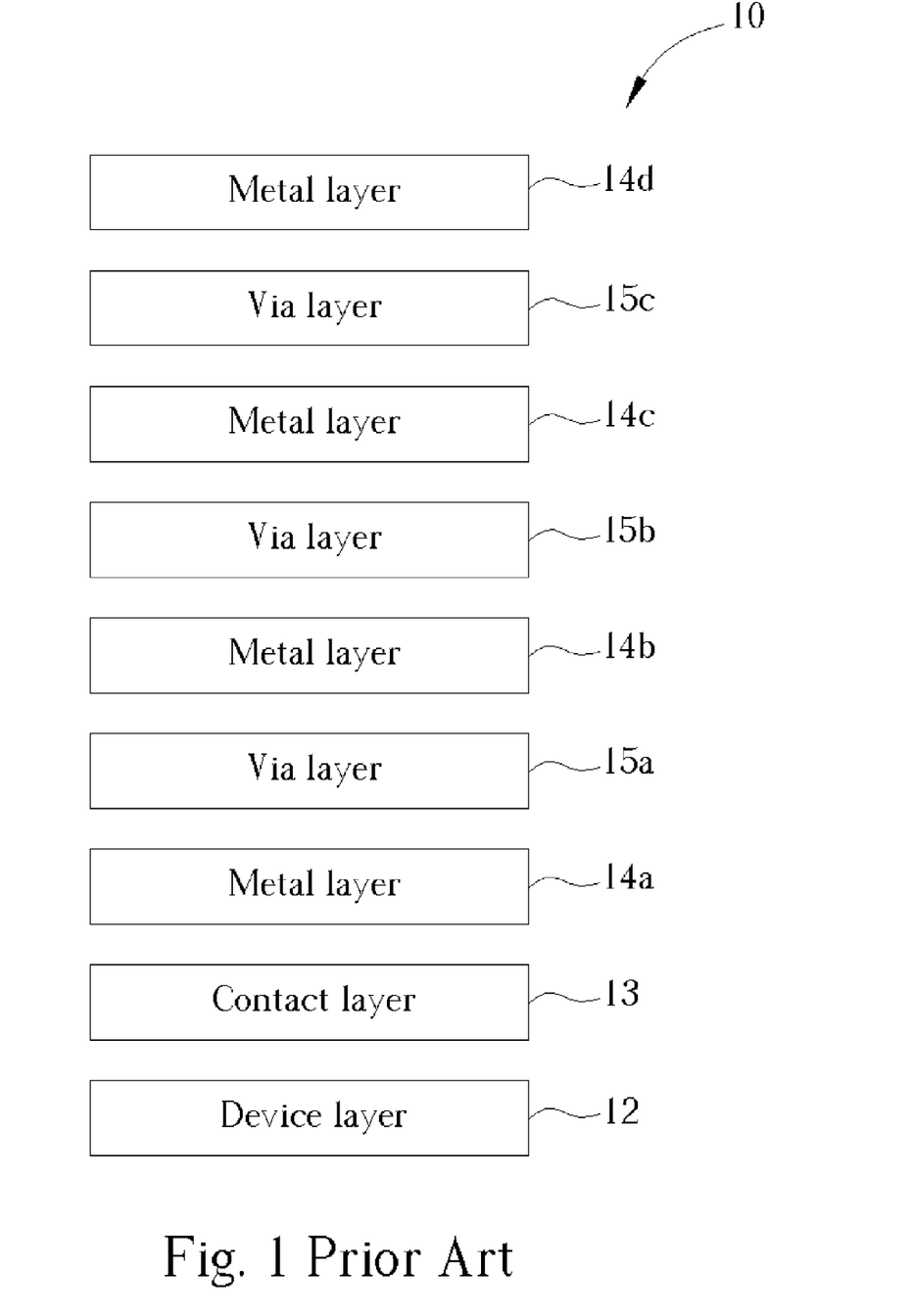
FIG. 1 is a schematic diagram of a structure of a prior art IC.

Please refer to FIG. 1. FIG. 1 is a schematic diagram of a structure of a prior art IC 10. The IC 10 comprises a device layer 12, a contact layer 13, a plurality of metal layers 14a, 14b, 14c, and 14d, and a plurality of via layers 15a, 15b, and 15c. The device layer 12 comprises elements, such as NMOS and PMOS transistors, on a wafer. Generally speaking, a pre-metal dielectric layer (PMD layer) is formed on the device layer 12 to make the surface of the device layer 12 more planar in conventional processes. Then, the contact layer 13 is formed on the device layer 12, which contains a plurality of contact plugs for connecting the elements positioned on the device layer 12. For example, a contact plug may be used for contacting one of the gate, the source, and the drain of a NMOS transistor or a PMOS transistor of the device layer 12. This means the contact plugs serve as corresponding contacts of the elements on the device layer 12. After forming the contact layer 13, a plurality of photomasks are utilized to define routing patterns on the metal layers 14a, 14b, 14c, and 14d for forming metal traces. Besides, a plurality of photomasks can be used for defining vias on the via layer 15a for electrically connecting the metal traces on the metal layers 14a and 14b. Similarly, a plurality of photomasks may be used to form vias on the via layer 15b and the via layer 15c for electrically connecting the metal traces on the metal layers 14b and 14c and the metal layers 14c and 14d respectively. In addition, the metal layer 14d on the top is used for disposing global traces, such as clock traces and power traces. Therefore, for correctly executing a predetermined logic operation, the elements of the device layer 12 have to be connected through the metal layers 14a, 14b, 14c, and 14d and the via layers 15a, 15b, and 15c for establishing corresponding current routes so as to transfer signals correctly.

Figure 2:
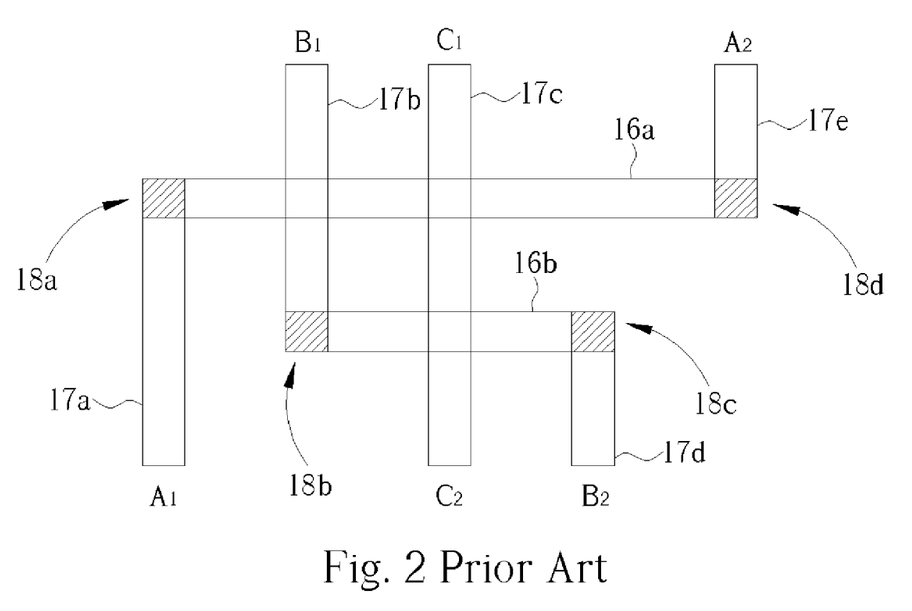
FIG. 2 is a schematic diagram of the metal layers 14b and 14c and the via layer 15b shown in FIG. 1.

Please refer to FIG. 2. FIG. 2 is a schematic diagram of the metal layers 14b and 14c shown in FIG. 1. The metal layer 14b comprises a plurality of horizontal metal traces 16a and 16b, and the metal layer 14c comprises a plurality of vertical metal traces 17a, 17b, 17c, 17d, and 17e. If the contact C1 of the metal layer 14c has to be electrically connected to the contact C2 of the metal layer 14c, only the metal trace 17c is needed for connecting the contacts C1 and C2 because the two contacts C1 and C2 are located in a same vertical track. However, if the contact A1 of the metal layer 14c has to be electrically connected to the contact A2 of the metal layer 14c, and the contact B1 of the metal layer 14c has to be electrically connected to the contact B2 of the metal layer 14c, the metal layer 14b and the via layer 15b have to be utilized to assist in connecting these contacts because the contacts A1, A2, B1, and B2 are located in different vertical tracks.

Referring to FIG. 2, the diagonal regions 18a, 18b, 18c, and 18d represent the overlapping regions of the metal traces 16a and 16b and the metal traces 17a, 17b, 17d, and 17e. For example, the metal trace 17a overlaps the metal trace 16a at the diagonal region 18a, and the metal trace 16a is overlapped with the metal trace 17e at the diagonal region 18d. Therefore, a via may be positioned in the via layer 15b at the diagonal region 18a for electrically connecting the metal traces 16a and 17a, and another via may be positioned in the via layer 15b at the diagonal region 18d for electrically connecting the metal traces 16a and 17e. Consequently, the contacts A1 and A2 can be electrically connected with each other through the metal traces 16a, 17a, 17e, and the vias positioned at the diagonal regions 18a and 18d. In the same way, the contact B1 can be electrically connected to the contact B2 through the metal traces 17b, 16b, 17d, and the vias positioned in the via layer 15b at the diagonal regions 18b and 18c which are the overlapping regions of the metal traces 17b, 16b and the metal traces 17d, 16b respectively.

As in the above description, the prior art makes uses of three photomasks to define the metal traces 16a, 16b, 17a, 17b, 17c, 17d, and 17e of the metal layers 14b, 14c, and the vias positioned at the diagonal regions 18a, 18b, 18c, 18d such that the IC 10 can execute a predetermined logic operation. However, even when the function of the IC 10 is slightly changed, those originally defined photomasks also have to be changed according to the changed current route design of the IC 10. For example, the patterns on the photomasks for defining the metal traces of the metal layers 14b and 14c have to be redesigned, thus the photomasks have to be refabricated. Accordingly, if there are only a few differences between two ICs having a similar main function, two specific photomasks have to be individually fabricated for these two ICs in the prior art. Therefore, the total fabrication cost of the IC rises because of the increased cost of additional photomasks.

SUMMARY OF INVENTION

It is therefore a primary objective of the claimed invention to provide a method for programming a routing layout design by using a single via layer to define the connections among the metal traces of two metal layers to solve the above-mentioned problem.

According to the claimed invention, the method for programming a routing layout design comprises: (a) forming a plurality of metal traces on a first routing layer and a plurality of metal traces on a second routing layer; and (b) positioning a plurality of vias within a via layer disposed between the first and second routing layers for electrically connecting the metal traces on the first and second routing layers according to a first current route defined by a predetermined circuit layout design used for connecting a first node and a second node so as to establish a second current route equivalent to the first current route.

It is an advantage of the claimed invention that the programming routing layout method only requires to modify specific designs of the photomask used for defining the via layer when the routing design is altered. Therefore, the additional costs of various photomasks for different ICs can be avoided.

These and other objectives of the claimed invention will no doubt become obvious to those of ordinary skill in the art after reading the following detailed description of the preferred embodiments, which are illustrated in the various figures and drawings.

DETAILED DESCRIPTION

Figure 3:
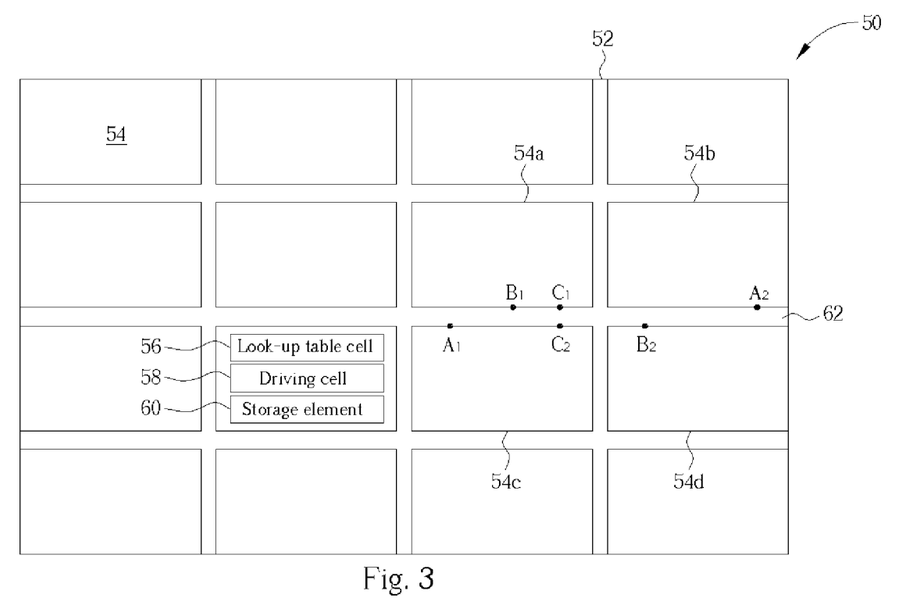
FIG. 3 is a schematic diagram of the routing structure applied to an OMPCA according to the present invention.

FIG. 3 is a schematic diagram of the routing layout applied to a one metal programmable cell array (OMPCA) 50 according to the present invention. As shown in FIG. 3, a semiconductor body 52 comprises a plurality of basic units 54 thereon, wherein the basic units 54 are arranged as an array. Each basic unit 54 comprises at least a look-up table cell 56, a driving cell 58, and a storage element 60. The basic units 54 are prefabricated on the semiconductor body 52 in a wafer factory. Then, an IC designer can program the routing layout of the metal layers on the semiconductor body 52 according to the function and requirement of the IC so as to design the functionality of each of the look-up table cells 56, driving cells 58, and storage elements 60 of each basic units 54 and the connections among the basic units 54. Afterward, the wafer factory forms the metal layers on the semiconductor body 52 by several photomasks according to the design of the routing layout so as to accomplish the desired IC. Each of the prefabricated look-up table cells 56 includes N inputs that can receive N input signals individually. The IC designer uses the metal layer positioned on the semiconductor body 52 to program the look-up table cells 56 to execute a combinational function according to the N variables. In other words, the IC designer can employ the metal layer positioned on the semiconductor body 52 to control one of the look-up table cells 56 so that the look-up table cell 56 contributes four inputs to receive four input signals with four variables and execute a specific combinational function according to these four variables. For example, the look-up table cell 56 can function as a 4-bit adder.

With regard to the prefabricated driving cell 58, it comprises transistors required for establishing a buffer or an inverter. Therefore, a driving cell 58 can be programmed to function as a buffer or an inverter according to the layout of the metal layer positioned on the semiconductor body 52 programmed by the IC designer. For the prefabricated storage element 60, it comprises transistors required for establishing a latch or a flip-flop. Similarly, the IC designer can program the metal layer to control each storage element 60 to execute the function of a latch or a flip-flop through an upper metal layer. To sum up, the IC designer is capable of controlling the basic units 54 to implement any defined logic functions by programming upper metal layers.

The above-mentioned metal layers, such as a third metal layer M3, not only can be used to program each basic unit 54, but can also can be used to position traces among basic units 54 through spare areas on the same metal layer. As shown in FIG. 3, the area of the metal layer (the third metal layer M3 or the fourth metal layer M4) corresponding to the routing channel 62 can be used to dispose metal traces for connecting each basic unit 54. The basic unit 54a includes two contacts B1 and C1; the basic unit 54b includes one contact A2; the basic unit 54c contains two contacts A1 and C2; and the basic unit 54d includes one contact B2. In this embodiment, the contacts A1, B1, and C1 have to be electrically connected to the contacts A2, B2, and C2 respectively. Accordingly, the third metal layer M3, the fourth metal layer M4, and a via layer between those two metal layers are utilized to connect the contacts A1, A2, B1, B2, C1, and C2.

Figure 4:
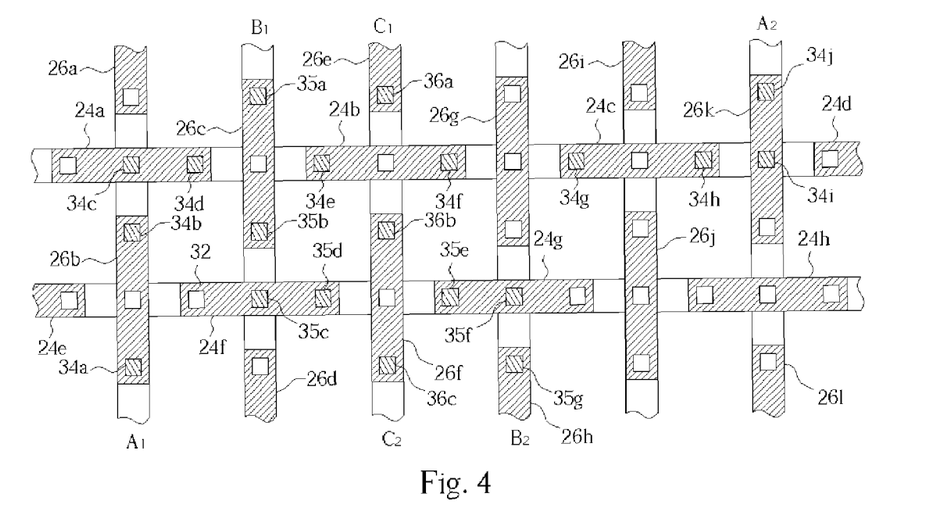
FIG. 4 is a top view of a first arrangement of metal traces of the routing structure according to the present invention.
Figure 5:
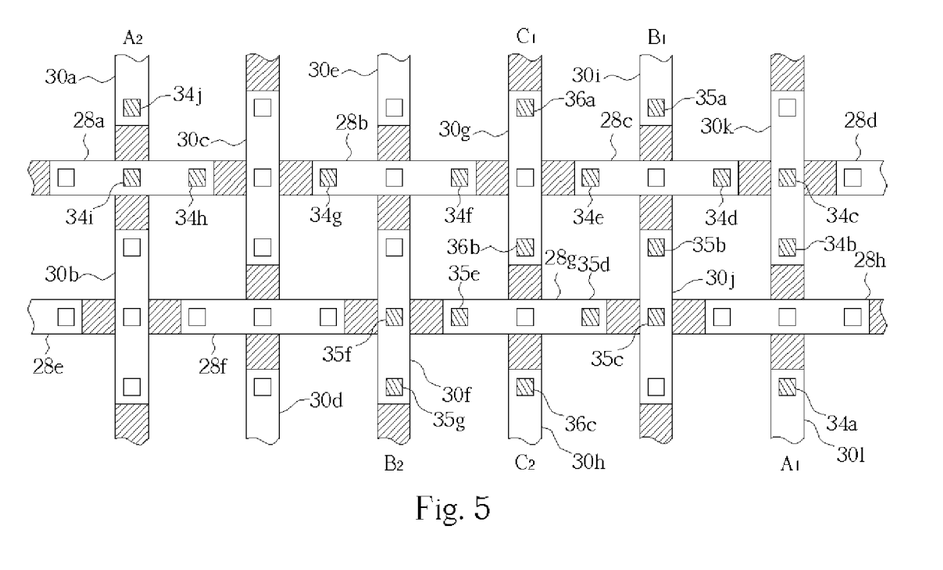
FIG. 5 is a bottom view of the first arrangement of metal traces of the routing structure shown in FIG. 4.

Please refer to FIGS. 4-5. FIG. 4 is a top view of a first arrangement of the metal traces of the routing structure according to the present invention. FIG. 5 is a bottom view of the first arrangement of the metal traces of the routing structure shown in FIG. 4. The routing structure of the present invention is positioned at the routing channel 62 shown in FIG. 3. In FIG. 4, the third metal layer M3 is positioned below the fourth metal layer M4 (the diagonal regions). Referring to FIG. 5, the fourth metal layer M4 (the diagonal regions) is positioned below the third metal layer M3. The horizontal tracks on the fourth metal layer M4 comprise a plurality of horizontal metal traces 24a, 24b, 24c, 24d, 24e, 24f, 24g, and 24h. The several vertical tracks on the fourth metal layer M4 also comprise a plurality of vertical metal traces 26a, 26b, 26c, 26d, 26e, 26f, 26g, 26h, 26i, 26j, 26k, and 26l. Similarly, the third metal layer M3 comprises a plurality of horizontal tracks containing a plurality of horizontal metal traces 28a, 28b, 28c, 28d, 28e, 28f, 28g, and 28h, and a plurality of vertical tracks containing a plurality of vertical metal traces 30a, 30b, 30c, 30d, 30e, 30f, 30g, 30h, 30i, 30j, 30k, and 30l. The overlapping regions of the horizontal metal traces 24a-24h and the vertical metal traces 26a-26l of the third metal layer M3, and the horizontal metal traces 28a-28h and the vertical metal traces 30a-30l of the fourth metal layer M4 are designed to be programming nodes 32 for disposing vias, such as the vias 35*d* and 35*e*, within the via layer between the third metal layer M3 and the fourth metal layer M4 to connect corresponding metal traces. For example, the vertical metal trace 30*l* can be electrically connected to the upper vertical metal trace 30*k* through the vias 34*a* and 34*b* in this embodiment. On the other hand, if the vertical metal trace 30*l* has to be electrically connected to the horizontal metal trace 28*c* for changing the direction of current route, positioning the vias 34*a*, 34*b*, 34*c*, and 34*d* can make the vertical metal trace 30*l* and the horizontal metal trace 28*c* be electrically connected in the preferred embodiment. Similarly, if the vertical metal trace 30*l* has to be electrically connected to the horizontal metal trace 28*d* for changing the direction of current route, appropriately positioning vias in the via layer between the third metal layer M3 and the fourth metal layer M4 will achieve the object of this embodiment. Therefore, the programming nodes 32 can be used for positioning vias to connect the metal traces shown in FIGS. 4-5 so as to control the direction of current routes for meeting any routing layout requirements.

Figure 6:
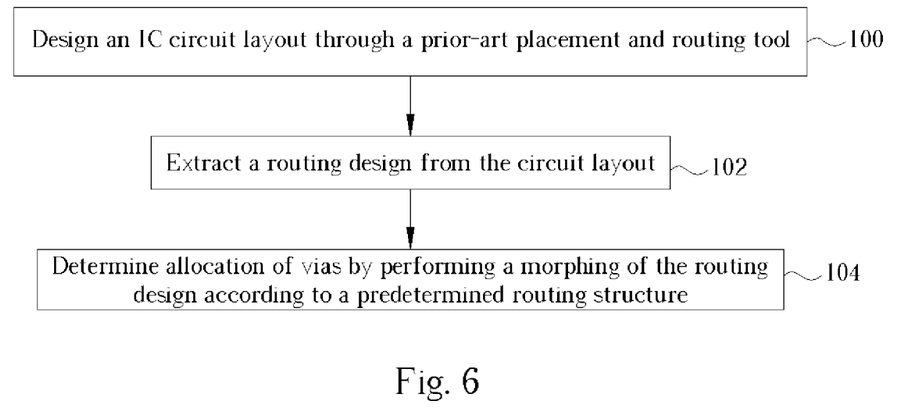
FIG. 6 is a flowchart of the method for programming a routing layout design according to the present invention.

Please refer to FIG. 6. FIG. 6 is a flowchart of the method for programming the routing layout shown in FIGS. 4-5 according to the present invention.

Step 100: Design an IC circuit layout through a prior art placement and routing tool;

Step 102: Extract a routing design from the circuit layout, wherein the routing design defines metal traces on a plurality of metal layers and corresponding vias within the via layers between different metal layers for electrically connecting the circuit elements;

Step 104: Perform a morphing of the routing design according to a predetermined routing structure so as to determine allocation of vias for the predetermined routing structure.

In general IC design processes, the name and function of each element has to be defined at the beginning. Then, a hardware description language(HDL) is used to create corresponding register transfer level (RTL) codes. After that, a test bench file is executed to perform a functional simulation for checking functionality. If the result matches requirements, a circuit synthesis tool is used to transfer the RTL codes into a corresponding gate-level netlist. The time-dependent characteristic of each element is then tested according to the information provided by a cell library. Finally, the prior art placement and routing tool is applied to accomplish the IC circuit layout (step 100), wherein the circuit layout defines the arrangement of the elements and the routing design for connecting the elements. The routing design serves to define a plurality of metal traces on a plurality of metal layers. The method according to the present invention extracts the information of routing design from the above-mentioned circuit layout (step 102). For example, the routing design made with the prior art placement and routing tool corresponds to the metal traces 16*a*, 16*b*, and 17*a*-17*e* shown in FIG. 2 for connecting the contacts A1, A2, B1, B2, C1, and C2 of the basic units 54*a*, 54*b*, 54*c*, and 54*d* shown in FIG. 3. As mentioned above, the routing structure of the present invention comprises the metal traces defined on the third metal layer M3 and the fourth metal layer M4 shown in FIGS. 4-5. Therefore, the present invention method designs which metal traces on the third metal layer M3 and the fourth metal layer M4 are needed and arranges required vias and programming nodes 32 according to the routing structure and the current routes defined with the metal traces 16*a*, 16*b*, and 17*a*-17*e* shown in FIG. 2 (step 104).

Taking the connection between the contacts A1 and A2 for example, the metal traces 16*a*, 17*a*, 17*e* shown in FIG. 2 can be replaced by the metal traces 24*a*, 24*b*, 24*c*, 26*b*, 26*k*, 28*a*, 28*b*, 28*c*, 30*a*, 30*k*, and 30*l* shown in FIGS. 4-5. And for electrically connecting the contacts A1 and A2, a plurality of vias 34*a*, 34*b*, 34*c*, 34*d*, 34*e*, 34*f*, 34*g*, 34*h*, 34*i*, and 34*j* have to be positioned at the overlapping regions of the metal traces 24*a*, 24*b*, 24*c*, 26*b*, 26*k*, 28*a*, 28*b*, 28*c*, 30*a*, 30*k*, and 30*l*. Therefore, the predetermined metal trace arrangements on the third metal layers M3 and the fourth metal layer M4 can be programmed through positioning the vias within the via layer between the third metal layer M3 and the fourth metal layer M4 so as to morph the routing layout shown in FIG. 2 and achieve the object of connecting the contacts A1 and A2. In other words, arranging the vias forms current routes equal to the current routes shown in FIG. 2. For example, concerning the connection between the contacts B1 and B2, the metal traces 16*b*, 17*b*, and 17*b* of FIG. 2 can be replaced by metal traces 24*f*, 24*g*, 26*c*, 26*h*, 28*g*, 30*f*, 30*i*, and 30*j* shown in FIGS. 4-5. Furthermore, in order to electrically connect the contacts B1 and B2, the vias 35*a*, 35*b*, 35*c*, 35*d*, 35*e*, 35*f*, and 35*g* have to be disposed at the overlapping regions of the metal traces 24*f*, 24*g*, 26*c*, 26*h*, 28*g*, 30*f*, 30*i*, and 30*j*. Arranging those vias through the via layer between the third metal layer M3 and the fourth metal layer M4 and utilizing the predetermined metal trace arrangements on the third metal layer M3 and the fourth metal layer M4 can morph the routing layout of FIG. 2 successfully to connect the contacts B1 and B2.

Similarly, taking the connection between the contacts C1 and C2 for example, the metal trace 17*c* of FIG. 2 can be replaced by the metal traces 26*e*, 26*f*, 30*g*, and 30*h* shown in FIGS. 4-5. And a plurality of vias 36*a*, 36*b*, and 36*c* have to be positioned at the overlapping regions of the metal traces 26*e*, 26*f*, 30*g*, and 30*h* for electrically connecting the contacts C1 and C2. This means that the predetermined metal trace arrangements on the third metal layer M3 and the fourth metal layer M4 can be adapted in designing the vias on the via layer between the third metal layer M3 and the fourth metal layer M4 to achieve the objective of morphing the routing design shown in FIG. 2 to correctly connecting the target contacts C1 and C2.

According to the same rule, a plurality of vias 34*a*, 34*b*, 34*c*, 34*d*, 34*e*, 34*f*, 34*g*, 34*h*, 34*i*, and 34*j* are positioned to connect the metal traces 24*a*, 24*b*, 24*c*, 26*b*, 26*k*, 28*a*, 28*b*, 28*c*, 30*a*, 30*k*, and 30*l* on the third metal layer M3 and the fourth metal layer M4 for connecting the contacts A1 and A2. Generally speaking, the impedance of a corresponding routing trace rises resulting from the vias so that the signal transmission performance of the routing trace will deteriorate. To resolve this problem, the metal trace arrangements of the routing structure shown in FIGS. 4-5 according to the present invention can be configured through metal traces with different lengths.

Figure 7:
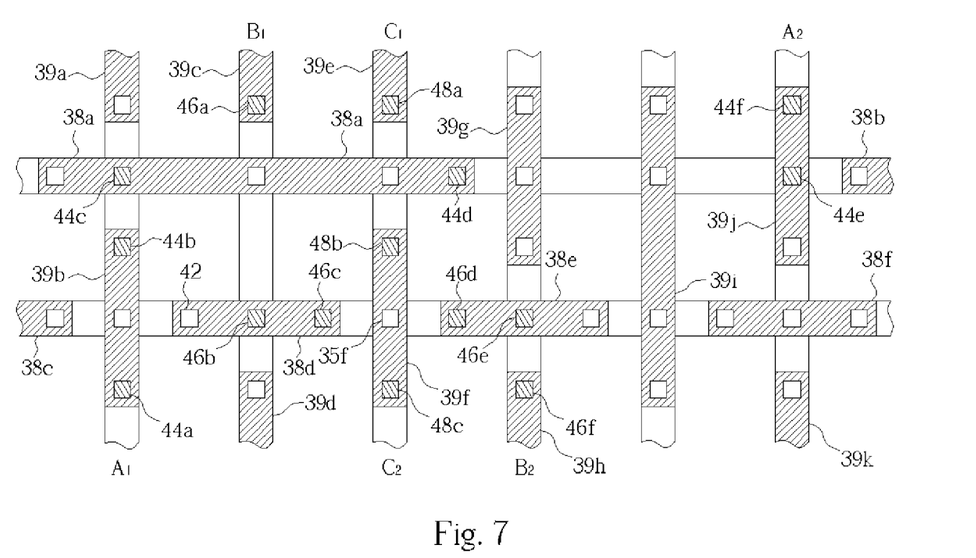
FIG. 7 is a top view of a second arrangement of metal traces of the routing structure according to the present invention.
Figure 8:
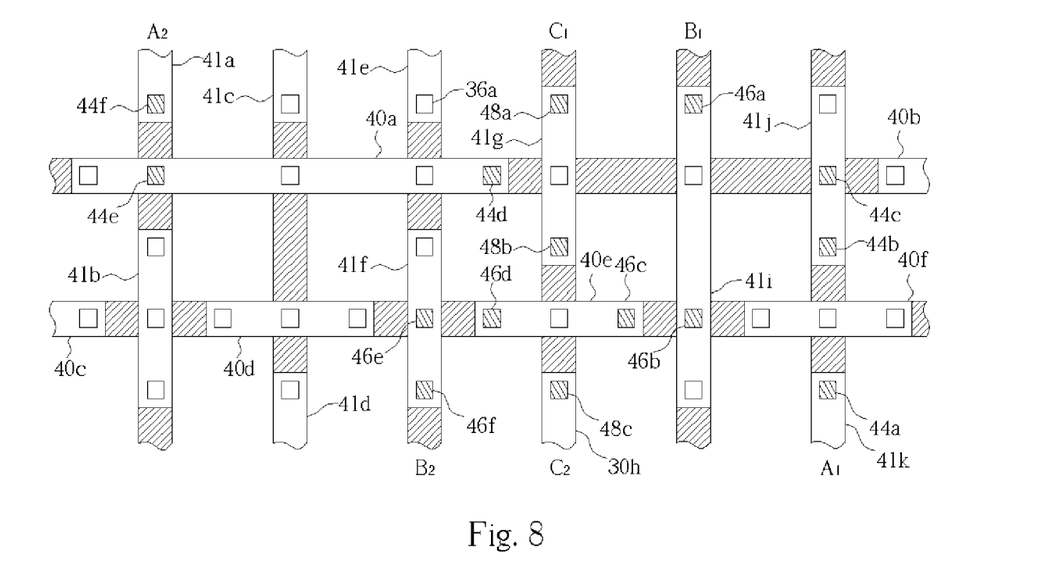
FIG. 8 is a bottom view of the second arrangement of metal traces of the routing structure shown in FIG. 7.

Please refer to FIGS. 7 and 8. FIG. 7 is a top view of a second arrangement of metal traces of the routing structure according to the present invention. FIG. 8 is a bottom view of the second arrangement of metal traces of the routing structure shown in FIG. 7. In FIG. 7, the third metal layer M3 is below the fourth metal layer M4 (the diagonal regions). In FIG. 8, the fourth metal layer M4 (the diagonal regions) is below the third metal layer M3. As shown in FIG. 7, the fourth metal layer M4 comprises a plurality of horizontal metal traces 38*a*, 38*b*, 38*c*, 38*d*, 38*e*, and 38*f* on a plurality of horizontal tracks and a plurality of vertical metal traces 39*a*, 39*b*, 39*c*, 39*d*, 39*e*, 39*f*, 39*g*, 39*h*, 39*i*, 39*j*, and 39*k* on a plurality of vertical tracks. And the third metal layer M3 comprises a plurality of horizontal metal traces 40a, 40b, 40c, 40d, 40e, and 40f on the horizontal tracks and a plurality of vertical metal traces 41a, 41b, 41c, 41d, 41e, 41f, 41g, 41h, 41i, 41j, and 41k on the vertical tracks. The overlapping regions of metal traces 38a-38f and 39a-39k of the third metal layer M3 and metal traces 40a-40f and 41a-41k of the fourth metal layer M4 are programming nodes 42 for positioning vias, such as the vias 46c and 46d, within the via layer between the third metal layer M3 and the fourth metal layer M4 for connecting corresponding metal traces.

The same steps shown in FIG. 6 can be performed to determine the vias corresponding to the metal trace arrangements shown in FIGS. 7-8. For connecting the contacts A1 and A2, the vias 44a, 44b, 44c, 44d, 44e, and 44f have to be positioned in the via layer between the third metal layer M3 and the fourth metal layer M4; for connecting the contacts B1 and B2, vias 46a, 46b, 46c, 46d, 46e, and 46f have to be disposed within the via layer; and for connecting the contacts C1 and C2, the vias 48a, 48b, and 48c have to be positioned in the via layer between the third metal layer M3 and the fourth metal layer M4, too. As shown in FIGS. 7-8, the horizontal metal trace 38a and the vertical metal trace 39i on the third metal layer M3 are longer metal traces, and the horizontal metal trace 40a and the vertical metal trace 41i on the fourth metal layer M4 are also longer metal traces. This design can decrease the required amount of vias so that the impedance of the routing trace can be decreased. For example, utilizing the longer horizontal metal trace 38a and 40a can eliminate the vias 34d and 34e and the vias 34g and 34h in FIG. 4 respectively. Similarly, positioning the longer vertical metal trace 41i can also eliminate the vias 35b shown in FIG. 4. Therefore, the routing structure of the present invention can utilize longer metal traces to decrease the required amount of the vias to reduce the impedance resulting from the vias so as to improve the transmission performance.

Although there are only two kinds of metal-trace lengths in the metal trace arrangements shown in FIGS. 7-8, the present invention routing structure is not limited to the metal traces with fixed length. This means that a plurality of metal traces with different lengths can be applied to the present invention routing structure for designing the metal trace arrangements on the third metal layer M3 and the fourth metal layer M4. Then, the via arrangement in the via layer between the third metal layer M3 and the fourth metal layer M4 can be programmed through step 104. In addition, although the above-mentioned metal trace arrangements are applied to the third metal layer M3 and the fourth metal layer M4, the same method can also be applied to a process with more metal layers. For example, the 0.18 micro process and 0.13 micro process contain six and eight metal layers for positioning metal traces respectively, and both of the two processes can utilize the routing structure of the present invention by setting vias within the via layers to program the routing traces formed on the metal layers.

As in the above mentioned embodiments, the present invention method includes using two photomasks to define patterns on the routing layers, such as the third metal layer M3 and the fourth metal layer M4, according to the metal trace arrangements shown in FIGS. 4-5 or FIGS. 7-8, and morphing the routing design to determine the desired vias corresponding the metal trace arrangements (step 104) by using another photomask to define the vias. When the routing design is changed (for example, the contacts A1 and A2 have to be connected to the contacts B1 and B2, respectively), the two photomasks for defining the metal trace arrangements do not have to be changed. Only the photomask used for defining the vias needs to be revised, and the new via allocation is determined from morphing the new routing design according to the fixed metal trace arrangements on the metal layers M3 and M4. Accordingly, IC producers only have to design the photomask for defining the via layer to form the required circuits. Furthermore, the IC designer only needs to revise the photomask of the via layer when he wants to correct an error in circuit design or change the circuit function. Since the whole set of photomasks does not need to be re-fabricated, the cost of the IC can be effectively reduced. In addition, the present invention method can be applied to a multi-layer circuit board by disposing the metal trace arrangements of the FIGS. 4-5 or FIGS. 7-8 on two circuit boards and morphing an original current route according to the metal trace arrangements to design the via arrangement. If the current route between two contacts has to be changed, only the corresponding vias have to be adjusted without changing the metal trace arrangement on each circuit board. Therefore, the fabrication cost of multi-layer circuit boards can also be reduced.

In contrast to the prior art, the present invention routing structure and method of programming a routing layout comprise morphing a predetermined routing layout according to the metal trace arrangements of two metal layers to design the vias of the via layer between the two metal layers. Thus only the via arrangement needs to be revised when the routing layout changes. Accordingly, the photomasks for defining the metal trace arrangements of the metal layers can be reused when an IC producer produces two different kinds of ICs by way of only programming the via arrangements and fabricating the photomasks of the via layers between the metal layers according to the function of these two kinds of ICs. The present invention routing structure and method require only the photomask of the via layer to control the connection of all the contacts inside the ICs, and the other photomasks of the ICs do not have to be fabricated for different kinds of ICs. To conclude the above description, the present invention routing structure and method can reduce the fabrication cost of photomasks of the fabrication process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a routing layout design, the method comprising:
(a) forming a plurality of metal traces on a first routing layer and a second routing layer, comprising:
positioning a plurality of first conducting wires and a plurality of second conducting wires on a plurality of horizontal tracks and a plurality of vertical tracks of the first routing layer respectively; and
positioning a plurality of third conducting wires and a plurality of fourth conducting wires on a plurality of horizontal tracks and a plurality of vertical tracks of the second routing layer respectively, the third conducting wire on a $k^{th}$ horizontal track of the second routing layer vertically overlapping the first conducting wire on the $k^{th}$ horizontal track of the first routing layer; and
(b) positioning a plurality of vias within a via layer disposed between the first and second routing layers for connecting the metal traces on the first and second routing layers according to a first current route defined by a predetermined circuit layout design used for connecting a first node and a second node so as to establish a second current route equivalent to the first current route.

2. The method of claim 1, wherein the step (b) comprises:
positioning one of the vias within the via layer for electrically connecting the first conducting wire on the $k^{th}$ horizontal track of the first routing layer and the third conducting wire on the $k^{th}$ horizontal track of the second routing layer when the first node and the second node are electrically connected to the first conducting wire on the $k^{th}$ horizontal track of the first routing layer and the third conducting wire on the $k^{th}$ horizontal track of the second routing layer respectively.

3. The method of claim 1, wherein the metal traces on the first routing layer and the corresponding metal traces on the second routing layer have substantially the same lengths.

4. The method of claim 1 being applied to a multi-layer circuit board.

5. The method of claim 1 being applied to a semiconductor device.

6. A method for fabricating a routing layout design, the method comprising:
(a) forming a plurality of metal traces on a first routing layer and a second routing layer, comprising:
positioning a plurality of first conducting wires and a plurality of second conducting wires on a plurality of horizontal tracks and a plurality of vertical tracks of the first routing layer respectively; and
positioning a plurality of third conducting wires and a plurality of fourth conducting wires on a plurality of horizontal tracks and a plurality of vertical tracks of the second routing layer respectively, the third conducting wire on an $m^{th}$ horizontal track of the second routing layer partially overlapping the second conducting wire on an $n^{th}$ vertical track of the first routing layer; and
(b) positioning a plurality of vias within a via layer disposed between the first and second routing layers for connecting the metal traces on the first and second routing layers according to a first current route defined by a predetermined circuit layout design used for connecting a first node and a second node so as to establish a second current route equivalent to the first current route.

7. The method of claim 6, wherein the step (b) comprises:
positioning one of the vias within the via layer for electrically connecting the second conducting wire on the $n^{th}$ vertical track of the first routing layer and the third conducting wire on the $m^{th}$ horizontal track of the second routing layer when the first node is electrically connected to the second conducting wire on the $n^{th}$ vertical track of the first routing layer and the second node is electrically connected to the third conducting wire on the $m^{th}$ horizontal track of the second routing layer.

8. The method of claim 6, wherein the third conducting wire on the $m^{th}$ horizontal track of the second routing layer partially overlaps the first conducting wire on the $m^{th}$ horizontal track of the first routing layer, and the first conducting wire on the $m^{th}$ horizontal track of the first routing layer partially overlaps the fourth conducting wire on the $n^{th}+1$ vertical track of the second routing layer.

9. The method of claim 6, wherein the second conducting wire on the $n^{th}$ vertical track of the first routing layer partially overlaps the fourth conducting wire on the $n^{th}$ vertical track of the second routing layer, and the first conducting wire on the $m^{th}+1$ horizontal track of the first routing layer partially overlaps the fourth conducting wire on the $n^{th}$ vertical track of the second routing layer.

10. A method for fabricating a routing layout design, the method comprising:
(a) forming a plurality of metal traces on a first routing layer and a second routing layer, comprising:
positioning a plurality of first conducting wires and a plurality of second conducting wires on a plurality of horizontal tracks and on a plurality of vertical tracks of the first routing layer respectively; and
positioning a plurality of third conducting wires and a plurality of fourth conducting wires on a plurality of horizontal tracks and on a plurality of vertical tracks of the second routing layer respectively, the fourth conducting wire on an $r^{th}$ vertical track of the second routing layer partially overlapping the second conducting wire on the $r^{th}$ vertical track of the first routing layer; and
(b) positioning a plurality of vias within a via layer disposed between the first and second routing layers for connecting the metal traces on the first and second routing layers according to a first current route defined by a predetermined circuit layout design used for connecting a first node and a second node so as to establish a second current route equivalent to the first current route.

11. The method of claim 10, wherein the step (b) comprises:
positioning one of the vias within the via layer for electrically connecting the second conducting wire on the $r^{th}$ vertical track of the first routing layer and the fourth conducting wire on the $r^{th}$ vertical track of the second routing layer when the first node is electrically connected to the second conducting wire on the $r^{th}$ vertical track of the first routing layer and the second node is electrically connected to the fourth conducting wire on the $r^{th}$ vertical track of the second routing layer.

12. A method for fabricating a routing layout design, the method comprising:
(a) forming a plurality of metal traces on a first routing layer and a second routing layer, comprising:
positioning a plurality of first conducting wires and a plurality of second conducting wires on a plurality of horizontal tracks and on a plurality of vertical tracks of the first routing layer respectively; and
positioning a plurality of third conducting wires and a plurality of fourth conducting wires on a plurality of horizontal tracks and on a plurality of vertical tracks of the second routing layer respectively, the fourth conducting wire on an $s^{th}$ vertical track of the second routing layer partially overlapping the first conducting wire on a $t^{th}$ horizontal track of the first routing layer; and
(b) positioning a plurality of vias within a via layer disposed between the first and second routing layers for connecting the metal traces on the first and second routing layers according to a first current route defined by a predetermined circuit layout design used for connecting a first node and a second node so as to establish a second current route equivalent to the first current route.

13. The method of claim 12, wherein the step (b) comprises:
positioning one of the vias within the via layer for electrically connecting the first conducting wire on the $t^{th}$ horizontal track of the first routing layer and the fourth conducting wire on the $s^{th}$ vertical track of the second routing layer when the first node is electrically connected to the first conducting wire on the $t^{th}$ horizontal track of the first routing layer and the second node is electrically connected to the fourth conducting wire on the $s^{th}$ vertical track of the second routing layer.

14. The method of claim 12, wherein the first conducting wire on the $t^{th}$ horizontal track of the first routing layer partially overlaps the third conducting wire on the $t^{th}$ horizontal track of the second routing layer, and the third conducting wire on the $t^{th}$ horizontal track of the second routing layer partially overlaps the second conducting wire on the $s^{th}+1$ vertical track of the first routing layer.

15. The method of claim 12, wherein the second conducting wire on the $s^{th}$ vertical track of the second routing layer partially overlaps the second conducting wire on the $s^{th}$ vertical track of the first routing layer, and the second conducting wire on the $s^{th}$ vertical track of the first routing layer partially overlaps the third conducting wire on the $t^{th}+1$ horizontal track of the first routing layer.

* * * * *